United States Patent
Yoon et al.

(10) Patent No.: US 10,431,488 B2
(45) Date of Patent: Oct. 1, 2019

(54) LIFT PIN AND METHOD FOR MANUFACTURING SAME

(71) Applicant: KOMICO CO., LTD., Anseong-si, Gyeonggi-do (KR)

(72) Inventors: Sung Hee Yoon, Cheongju-si (KR); Kwon Ho Jung, Suwon-si (KR)

(73) Assignee: KOMICO CO., LTD., Anseong-si, Gyeonggi-Do (KR)

( * ) Notice: Subject to any disclaimer, the term of this patent is extended or adjusted under 35 U.S.C. 154(b) by 0 days.

(21) Appl. No.: 15/556,167

(22) PCT Filed: Jan. 22, 2016

(86) PCT No.: PCT/KR2016/000687
§ 371 (c)(1),
(2) Date: Sep. 6, 2017

(87) PCT Pub. No.: WO2016/148385
PCT Pub. Date: Sep. 22, 2016

(65) Prior Publication Data
US 2018/0053683 A1    Feb. 22, 2018

(30) Foreign Application Priority Data
Mar. 19, 2015 (KR) .................. 10-2015-0037961

(51) Int. Cl.
*C30B 25/12* (2006.01)
*H01L 21/687* (2006.01)
(Continued)

(52) U.S. Cl.
CPC ........ *H01L 21/68742* (2013.01); *C23C 16/24* (2013.01); *C23C 16/4581* (2013.01);
(Continued)

(58) Field of Classification Search
CPC ......... C30B 25/00; C30B 25/02; C30B 25/12; C30B 25/08
See application file for complete search history.

(56) References Cited

U.S. PATENT DOCUMENTS 7,422,655 B2 * 9/2008 Asakura ............ H01L 21/68742
                                                           118/724
8,858,715 B2 * 10/2014 Van Munster ...... C23C 16/4581
                                                           118/728
(Continued)

FOREIGN PATENT DOCUMENTS

JP    2003-142407    5/2003
JP    2006-143587    6/2006
(Continued)

OTHER PUBLICATIONS

International Search Report for International Application No. PCT/KR2016/000687, dated Jun. 15, 2016.
(Continued)

*Primary Examiner* — Robert M Kunemund
(74) *Attorney, Agent, or Firm* — Kile Park Reed & Houtteman PLLC

(57) ABSTRACT

A lift pin passes through a hole of a susceptor on which a wafer is placed inside a process chamber in which an epitaxial process is performed with respect to the wafer, to support the wafer, and has a surface formed of a glassy carbon material.

8 Claims, 7 Drawing Sheets

(51) Int. Cl.
*C23C 16/24* (2006.01)
*C23C 16/458* (2006.01)
*C23C 16/46* (2006.01)
*C30B 29/06* (2006.01)
*H01L 21/205* (2006.01)

(52) U.S. Cl.
CPC .......... *C23C 16/4586* (2013.01); *C23C 16/46* (2013.01); *C30B 25/12* (2013.01); *C30B 29/06* (2013.01); *H01L 21/205* (2013.01); *H01L 21/68757* (2013.01)

(56) References Cited

U.S. PATENT DOCUMENTS

| | | | |
|---|---|---|---|
| 2010/0086784 A1* | 4/2010 | Patalay | H01L 21/68742 428/411.1 |
| 2011/0114014 A1* | 5/2011 | Sakurai | C23C 16/24 117/88 |
| 2012/0015454 A1* | 1/2012 | Narahara | C23C 16/24 438/5 |
| 2014/0265098 A1* | 9/2014 | Himmelsbach | B23Q 7/005 269/54.4 |
| 2014/0349469 A1* | 11/2014 | Sasagawa | B05D 1/00 438/504 |

FOREIGN PATENT DOCUMENTS

| | | |
|---|---|---|
| JP | 2009-197331 | 9/2009 |
| JP | 2010-034476 | 2/2010 |
| JP | 2010-34476 | 2/2010 |
| JP | 2011-505691 | 2/2011 |
| JP | 2014-11166 | 1/2014 |
| KR | 10-2003-0007719 | 1/2003 |
| KR | 10-2010-0113069 | 10/2010 |

OTHER PUBLICATIONS

Office Action for Japanese Application No. 2017-545887 with English translation, dated Aug. 14, 2018.

\* cited by examiner

LIFT PIN AND METHOD FOR MANUFACTURING SAME

CROSS-REFERENCE TO RELATED APPLICATION

This application claims priority to Korean Patent Application No. 10-2015-0037961 filed on Mar. 19, 2015 and all the benefits accruing there from under 35 U.S.C. § 119, the contents of which are incorporated by reference in their entirety.

TECHNICAL FIELD

The present disclosure relates to a lift pin and a method of manufacturing the same, and more particularly, to a lift pin and a method of manufacturing the same, the lift pin passing through a hole of a susceptor on which a wafer is placed to support the wafer in an epitaxial process performed with respect to the wafer.

BACKGROUND ART

In general, semiconductor devices may be manufactured by performing, on the basis of a wafer including a thin single crystalline substrate of a silicone material, a FAB process for forming a plurality of chips with circuit patterns patterned on the wafer, a bonding process for electrically connecting each of the chips formed through the FAB process, a molding process for protecting the chips connected to the substrate from the outside, and the like. Here, the wafer is prepared in such a way that a cylinder-shaped ingot is thinly sliced, and a polishing process for smoothing a surface of the wafer is then performed.

Recently, as semiconductor devices are highly integrated, it is difficult to decrease the surface roughness of a wafer only through a polishing process on the surface of the wafer. Accordingly, it is difficult to realize a circuit pattern having a fine line width, specifically approximately 12 nm to approximately 16 nm, on the wafer. Therefore, an epitaxial process is further performed with respect to the wafer on which the polishing process is performed, such that the surface roughness of the wafer is decreased to a level of approximately 30% or further to approximately 50%.

Here, the epitaxial process is performed by using an epitaxial apparatus including: a process chamber into which a silane gas is injected; a susceptor on which a wafer on which a polishing process has been completed inside the process chamber is placed; a lift pin driven to move up and down while passing through holes of the susceptor to place the wafer on the susceptor or space the wafer apart from the susceptor; and a heater providing the inside of the process chamber with heat such that the wafer is heated to a temperature of approximately 1000° C. to approximately 1400° C.

Specifically, the epitaxial process is performed in such a manner that the silane gas provided into the process chamber reacts with the wafer surface through the heat from the heater to grow a crystal, and then the growing crystal fills clearances on the wafer surface. Therefore, a thin film of approximately several microns is formed on the wafer surface, thereby decreasing the surface roughness of the wafer or removing defects on the wafer to obtain a high-quality wafer. Here, while the epitaxial process is performed, the wafer is heated by means of the heater to a high temperature of approximately 1000° C. to approximately 1400° C., and thus a small bending phenomenon cannot but occur in the wafer.

Since the bending phenomenon occurs while the lift pin directly contacts and supports the wafer, the lift pin may also generates a scratch on the wafer in which the bending phenomenon occurs. Further, since the lift pin is driven to move up and down along the hole of the susceptor, vibration is generated by the friction between the lift pin and the susceptor, and a scratch, a dent, a ground out, or the like may occur. Since the wafer is damaged by a scratch, a dent, a ground out, or the like and particles are generated due to the damage to the wafer, the surface quality of the wafer may be deteriorated. Also, the quality of the thin film formed on the wafer surface by the epitaxial process may be deteriorated.

DETAILED DESCRIPTION OF THE INVENTION

Technical Problem

The present disclosure provides a lift pin which stably supports a wafer in which a bending phenomenon occurs and is thereby capable of maintaining the wafer quality as it is.

The present disclosure provides a method of manufacturing the lift pin.

Technical Solution

In accordance with an exemplary embodiment, a lift pin passing through a hole of a susceptor on which the wafer is placed inside a process chamber in which an epitaxial process for the wafer is performed to support the wafer, and having a surface formed of a glassy carbon material, the lift pin includes: a pin head disposed on an upper portion of the lift pin, the upper portion contacting the wafer; a shaft passing through the hole of the susceptor; and a pin neck having, between the pin head and the shaft, an outer circumferential surface inclinedly formed to be gradually narrower from the pin head to the shaft.

The lift pin may have a structure in which a base member formed of ceramic is coated with the glassy carbon.

The pin head may have a portion which contacts the wafer and has a rounded shape.

The contact portion of the pin head which contacts the wafer may have a curvature of radius (R) of approximately 11 mm to approximately 17 mm.

The pin neck may have an inclined angle within ±5° with respect to an inclination angle formed on an upper end portion of the hole.

The shaft may have an outer diameter smaller by approximately 2% to approximately 10% than the diameter of the hole.

The pin head, the shaft, and the pin neck may have surfaces having a roughness of approximately 0.1 μm to approximately 0.5 μm.

In accordance with another exemplary embodiment, a method of manufacturing a lift pin, which passes through a hole of a susceptor on which a wafer is placed to support the wafer inside a process chamber in which an epitaxial process for the wafer is performed, the method includes: preparing a base including a pin head having a surface formed of a glassy carbon material, and contacting the wafer to support the wafer, a shaft passing through the hole of the susceptor, and a pin neck formed between the pin head and the shaft; and performing a mirror surface treatment on a surface of the base.

In the performing of a mirror surface treatment, the surface of the base may be polished to have a roughness of approximately 0.1 μm to approximately 0.5 μm. The preparing of the base may prepare the base by coating a base member formed of ceramic with a glassy carbon.

Advantageous Effects

In accordance with embodiments of the present invention, a lift pin, which is driven to move up and down while passing through a hole of a susceptor, on which a wafer is placed, to substantially support the wafer inside a process chamber in which an epitaxial process is performed on the wafer, is manufactured of a glassy carbon material which has a superior hardness such that a portion contacting the wafer in the lift pin may be roundly machined, and thus the wafer in which a bending phenomenon occurs during the epitaxial process may be stably supported without generating particles caused by a scratch, a dent, a ground out, or the like.

Accordingly, when the epitaxial process is performed by using the lift pin, a thin film for decreasing the surface roughness on the wafer surface may be stably formed. Therefore, the quality of highly integrated semiconductor devices manufactured from the wafer may be improved, and a high yield of semiconductor devices may also be simultaneously expected.

BEST MODE

Figure 1:
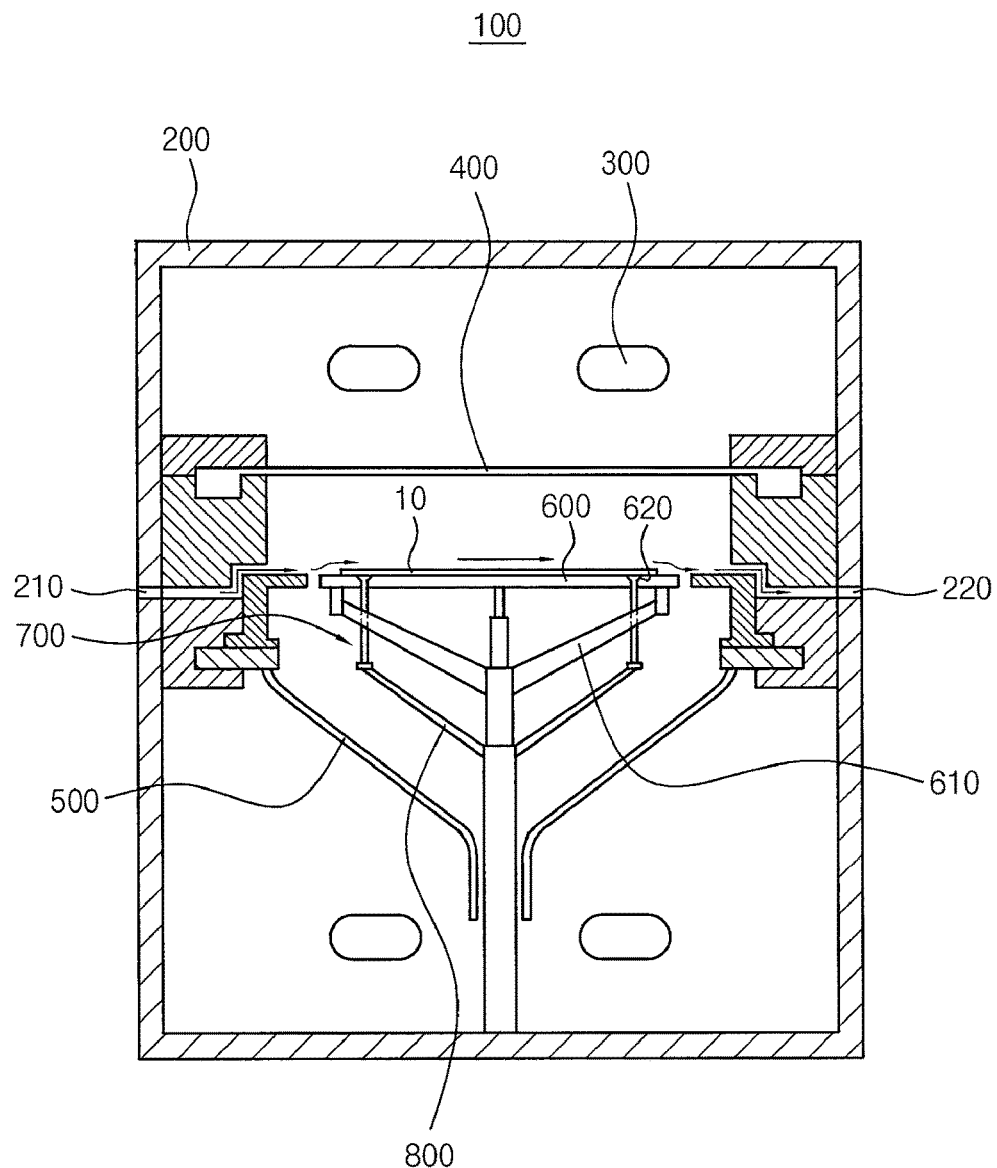
FIG. 1 is a schematic configuration diagram illustrating an epitaxial apparatus in which a lift pin in accordance with an exemplary embodiment is installed.

In accordance with an exemplary embodiment, a lift pin passing through a hole of a susceptor on which the wafer is placed inside a process chamber in which an epitaxial process for the wafer is performed to support the wafer, and having a surface formed of a glassy carbon material, the lift pin includes: a pin head disposed on an upper portion of the lift pin, the upper portion contacting the wafer; a shaft passing through the hole of the susceptor; and a pin neck having, between the pin head and the shaft, an outer circumferential surface inclinedly formed to be gradually narrower from the pin head to the shaft.

Mode of the Invention

Hereinafter, exemplary embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art.

It will also be understood that when an element is referred to as being 'on' or connected to another element or a layer, it can be directly on the other one, or one or more intervening layers, films, regions or plates may also be present. Alternatively, it will also be understood that when an element is referred to as being directly disposed on or connected to another element, still another element may not be present between them. It will be understood that although the terms first, second, third, etc. are used herein to describe various items, such as various elements, compositions, regions, layers and/or portions, these items should not be limited by these terms.

In the following description, the technical terms are used only for explaining a specific exemplary embodiment while not limiting the present invention. Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described with reference to schematic drawings of preferred embodiments. As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. Thus, the regions illustrated in the figures are schematic in nature and their shapes do not necessarily illustrate the actual shape of a region of a device and do not limit the scope of the present invention.

FIG. 1 is a schematic configuration diagram illustrating an epitaxial apparatus in which a lift pin in accordance with an exemplary embodiment is installed.

Referring to FIG. 1, an epitaxial apparatus 100 includes a process chamber 200, a heater 300, an upper dome 400, a lower dome 500, a susceptor 600, a lift pin 700, and a pin drive part 800.

The process chamber 200 provides a space for performing an epitaxial process for a wafer 10 on which a polishing process is performed. The process chamber 200 may include, on a side portion thereof, a gas supply part 210 for injecting a silane gas for a reaction in the epitaxial process and a gas discharge part 220.

The heater 300 is disposed inside the process chamber 200. The heater 300 provides the wafer 10 with heat for reaction in the epitaxial process. Specifically, the heater 300 may provide the heat such that the wafer 10 may be heated to a process temperature of approximately 1000° C. to approximately 1400° C. for the epitaxial process. This heater 300 is disposed inside the process chamber 200 and is thus substantially difficult to replace. Therefore, the heater 300 may be a halogen lamp which has a long lifespan and may provide uniform heat through light. Also, the heater 300 may be provided in plurality in the upper and lower portions inside the process chamber 200 to substantially supply uniform heat to the upper and lower portion of the wafer 10.

Inside the process chamber 200, the upper dome 400 and the lower dome 500 are respectively disposed under the heater 300 disposed in the upper portion of the process chamber 200 and over the heater 300 disposed in the lower portion of the process chamber 200, so as to isolate the wafer 10 from the plurality of heaters 300. As such, the upper and lower domes 400 and 500 are formed of a transparent material such that the light generated from the heaters 300 may pass therethrough. Specifically, the upper and lower domes 400 and 500 may be formed of a quartz material. Here, both side portions of the upper and lower domes 400 and 500 are airtightly coupled to the gas supply part 210 and the gas discharge part 220 Accordingly, gases other than the silane gas are prevented from being introduced into a space in which the epitaxial process for the wafer 10 is performed.

The susceptor 600 is disposed inside the process chamber 200, and specifically, between the upper dome 400 and the lower dome 500 to support the wafer 10 while the epitaxial process is performed. Accordingly, the susceptor 600 may be formed of a silicon carbide (SiC) material having a superior hardness and a superior heat conductivity such that the heat from the heater 300 may be stably transferred to the wafer 10. Specifically, the susceptor 600 may be formed in a structure in which a base member formed of a graphite material is coated with the silicon carbide (SiC) for efficiency of manufacturing. This susceptor 600 is supported and fixed at a predetermined height by means of a support mechanism 610.

The lift pin 700 places the wafer 10 on the susceptor 600 or supports the wafer 10 to be spaced apart from the susceptor 600 while passing through a hole 620 vertically formed in the susceptor 600. Here, to stably support the wafer 10, the lift pin 700 may be disposed passing through the hole 620 of the susceptor 600 at three or more positions.

The pin drive part 800 is connected to a lower portion of the lift pin 700 to provide a linear driving force such that the lift pin 700 may be driven to move in the vertical direction. Accordingly, the pin drive part 800 may include a cylinder structure directly providing the linear driving force, and may also include a coupled structure of a servo motor and a power conversion mechanism which converts the torque of the servo motor into a linear direction.

Hereinafter, the characteristics of the lift pin 700 simply described above will be described in detail together with the core steps of the epitaxial process with reference to FIGS. 2 to 11.

Figure 2:
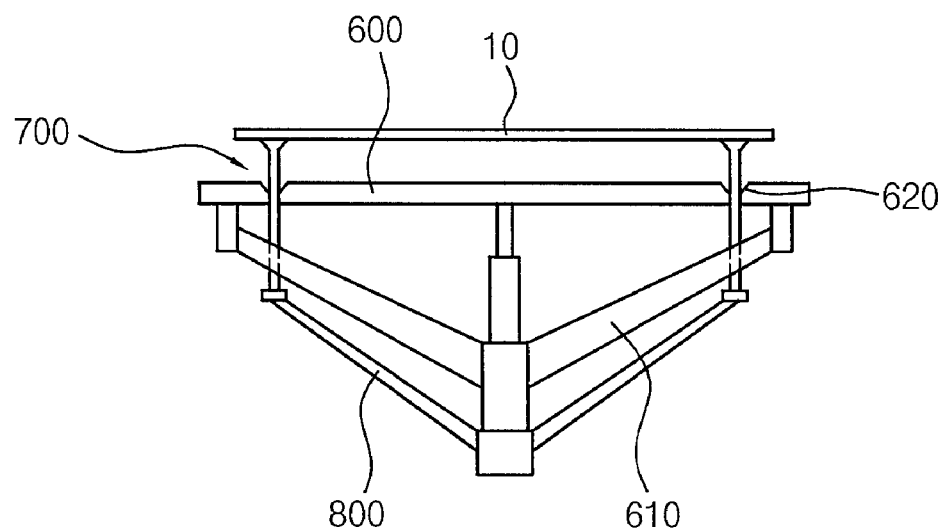
FIG. 2 is a view specifically illustrating a state in which a lift pin supports a wafer in the epitaxial apparatus illustrated in FIG. 1 before an epitaxial process.
Figure 3:
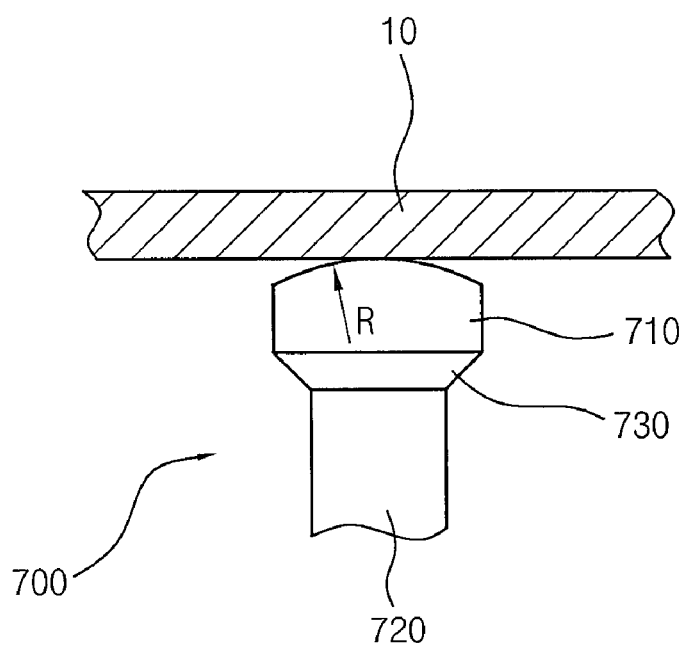
FIG. 3 is a view specifically illustrating a portion on which the lift pin contacts the wafer in FIG. 2.

FIG. 2 is a view specifically illustrating a state in which a lift pin supports a wafer in the epitaxial apparatus illustrated in FIG. 1 before an epitaxial process, and FIG. 3 is a view specifically illustrating a portion on which the lift pin contacts the wafer in FIG. 2.

Referring further to FIGS. 2 and 3, to perform the epitaxial process, the wafer 10 on which a polishing process has been completed is first loaded from the outside and supported by the lift pin 700 while the lift pin 700 is lifted from the susceptor 600.

Here, the lift pin 700 includes: a pin head 710 disposed at an upper portion thereof, and directly contacting the wafer 10; a shaft 720 passing through the hole 620 of the susceptor 600; and a pin neck 730 disposed between the pin head 710 and the shaft 720 to connect the pin head 710 and the shaft 720. Here, since the outer diameter of the pin head 710 is formed greater than that of the shaft 720, the outer circumferential surface of the pin neck 730 may be inclinedly formed to be gradually narrower from the pin head 710 toward the shaft 720.

When the lift pin 700 is driven to move in the vertical direction along the hole 620 of the susceptor 600 while supporting the wafer 10 at a process temperature of approximately 1000° C. to approximately 1400° C. at which the epitaxial process is performed, the lift pin 700 is required to have a sufficient hardness so that particles may basically not generated due to the friction between the wafer 10 and the susceptor 600. Also, in order to basically minimize scratches or particles which may be generated by the contact between the lift pin 700 and the wafer 10 when the lift pin 700 supports the wafer 10, the lift pin 700 is required to be machined to be rounded such that the pin head 710 is in point-contact with the wafer 10.

Accordingly, the lift pin 700 may be formed of glassy carbon such that both the aforementioned hardness and the machining of the rounding are satisfied. Specifically, the glassy carbon is a ceramic material which has a sufficient strength to a degree to have the flexural strength of approximately 147 MPa and a hardness corresponding to the strength, and is a stable material the characteristic of which is not changed even at a temperature of approximately 2000° C. Also, since the glassy carbon in a glass liquid crystal state has no crystalline phase in comparison with silicon carbide (SiC) having a crystalline phase, the glassy carbon is characterized by having a relatively superior machinability such that the machining of the rounding may be performed.

Also, the glassy carbon is characterized by having the surface roughness which is formed in a very low level of approximately 2 µm to approximately 3 µm due to the glassy liquid crystal state thereof in comparison with other ceramic materials. Accordingly, in manufacturing the lift pin 700, the pin head 710, the shaft 720, and the pin neck 730 are machined in the form of a base by using the glassy carbon, and then a mirror surface treatment process for polishing the surface of the base is performed to easily obtain the lift pin 700 having a very smooth surface with the surface roughness of approximately 0.1 µm to approximately 0.5 µm. Through this, when the lift pin 700 is driven to move in the vertical direction along the hole 620 of the susceptor 600 while the lift pin 700 supports the wafer 10 during performing the epitaxial process, the friction among the lift pin 700, the wafer 10, and the susceptor 600 may be more decreased to more stably prevent the generation of particles caused by the friction.

In accordance with the aforementioned embodiment, although it may be understood that the lift pin 700 itself is formed of a glassy carbon, it may be also understood that the same result may be obtained by entirely coating a base member formed of a ceramic material with the glassy carbon. In this case, the base member formed of a ceramic material may include any one of alumina (Al2O3), silicon carbide (SiC), or graphite (C).

Figure 4:
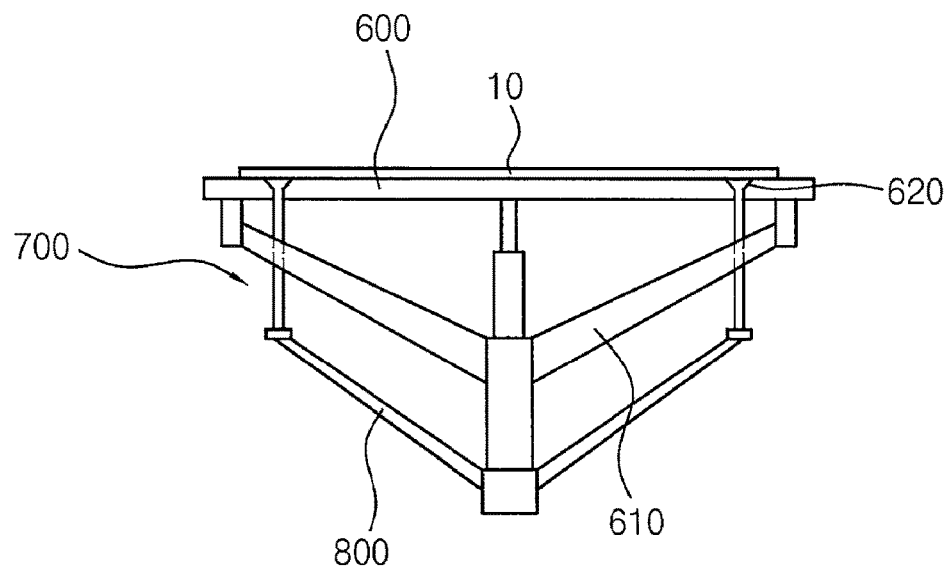
FIG. 4 is a view specifically illustrating a state in which the wafer is placed on a susceptor for the epitaxial process in the epitaxial apparatus illustrated in FIG. 1.
Figure 5:
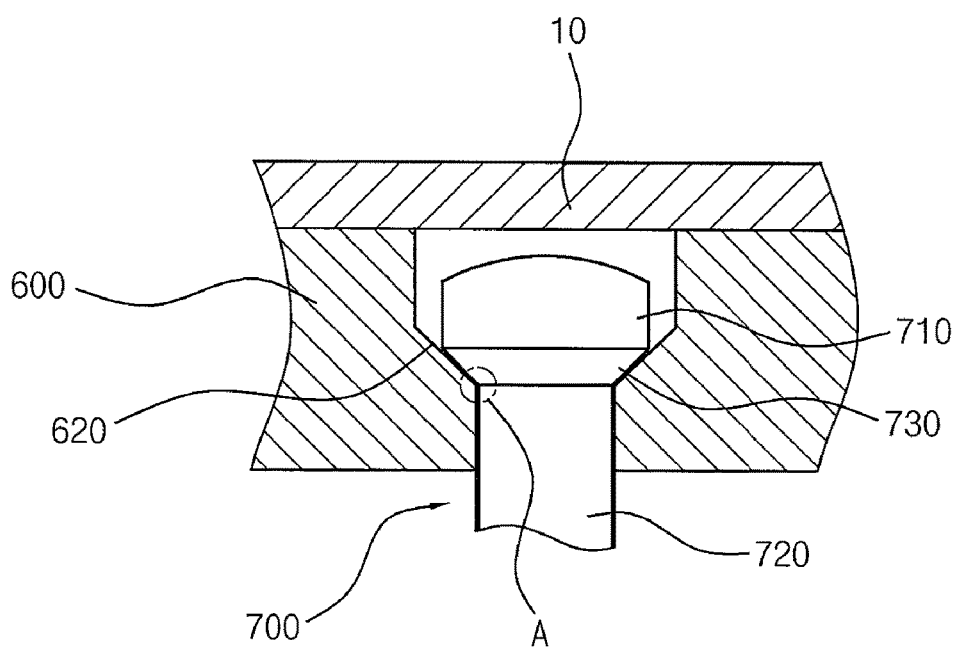
FIG. 5 is a view specifically illustrating a portion at which the wafer is placed on the susceptor.
Figure 6:
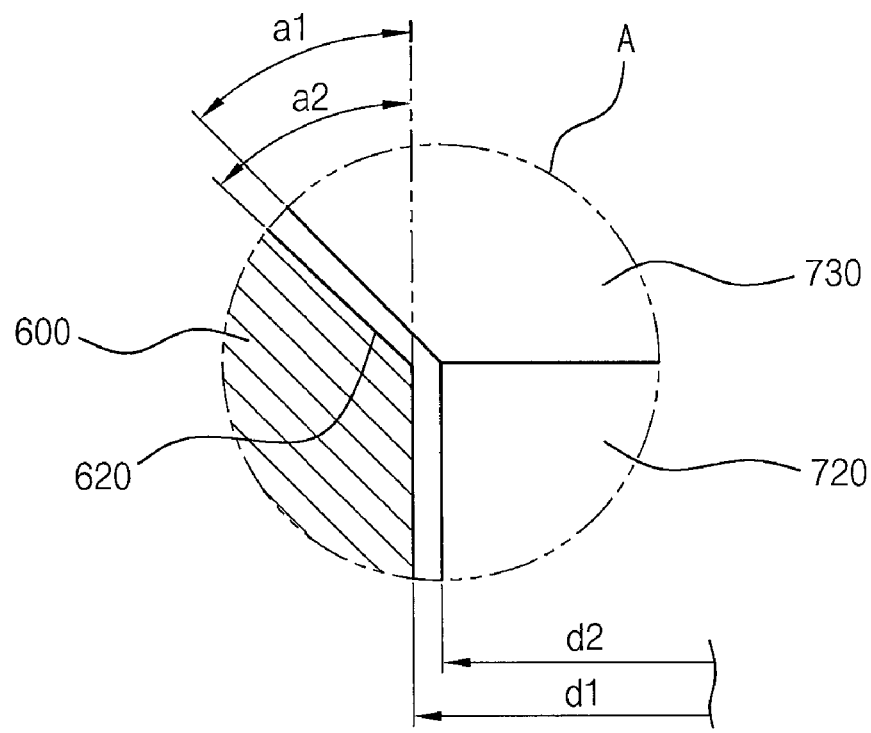
FIG. 6 is an enlarged view illustrating region A of FIG. 5.

FIG. 4 is a view specifically illustrating a state in which the wafer is placed on a susceptor for the epitaxial process in the epitaxial apparatus illustrated in FIG. 1, FIG. 5 is a view specifically illustrating a portion at which the wafer is placed on the susceptor, and FIG. 6 is an enlarged view illustrating region A of FIG. 5.

Referring further to FIGS. 4 to 6, the lift pin 700 is then moved down by using the pin drive part 800 such that the wafer 10 is placed on the susceptor 600.

Here, the pin neck 730 of the lift pin 700 is required to prevent the silane gas, provided to the wafer from the gas supply part 210 while the epitaxial process is performed, from leaking through the hole 620 of the susceptor 600. In the epitaxial process, the heat generated from the heater 300 is uniformly transferred to the wafer 10 placed on the susceptor 600. However, as heat flow is lost or leaks to a lower structure or the like through the hole 620, the heat may not be uniformly transferred to the wafer 10. Accordingly, a sufficient airtightness for the hole 620 is required to be maintained such that a defect is not generated by the epitxial process on the film formed on the wafer 10. For this, an inclination angle a1 of the pin neck 730 may be preferably approximately ±5° with respect to an inclination angle formed on an upper end portion of the hole 620 coupled to the pin neck 730.

Also, when the shaft 720 of the lift pin 700 has an outer diameter d2 smaller than the inner diameter d1 of the hole 620 of the susceptor 600 by less than approximately 2% of the inner diameter d1, the distance between the susceptor and the shaft 720 is too small. Accordingly, the friction force between the susceptor 600 and the shaft 720 is increased and the possibility of generating particles is increased. When the shaft 720 of the lift pin 700 has the outer diameter d2 smaller than the inner diameter d1 of the hole 620 of the susceptor 600 by more than approximately 10% of the inner diameter d1, the shaft 720 may be horizontally shaken when driven to move in the vertical direction along the hole 620. Accordingly, the lift pin 700 may not stably support the wafer 10. Thus, the shaft 720 of the lift pin 700 preferably has the outer diameter smaller than the inner diameter d1 of the hole of the susceptor 600 by approximately 2% to approximately 10% with respect to the inner diameter d1 of the hole 620 of the susceptor 600.

Also, since the lift pin 700 is formed of glassy carbon having the roughness of approximately 0.1 µm to approximately 0.5 the horizontality of the lower end of the lift pin 700 may also be accurately maintained, the lower end contacting the pin drive part 800. Therefore, the vertical stroke motion of the lift pin 700 by means of the pin drive part 800 may also be performed at a predetermined position at all times.

Figure 7:
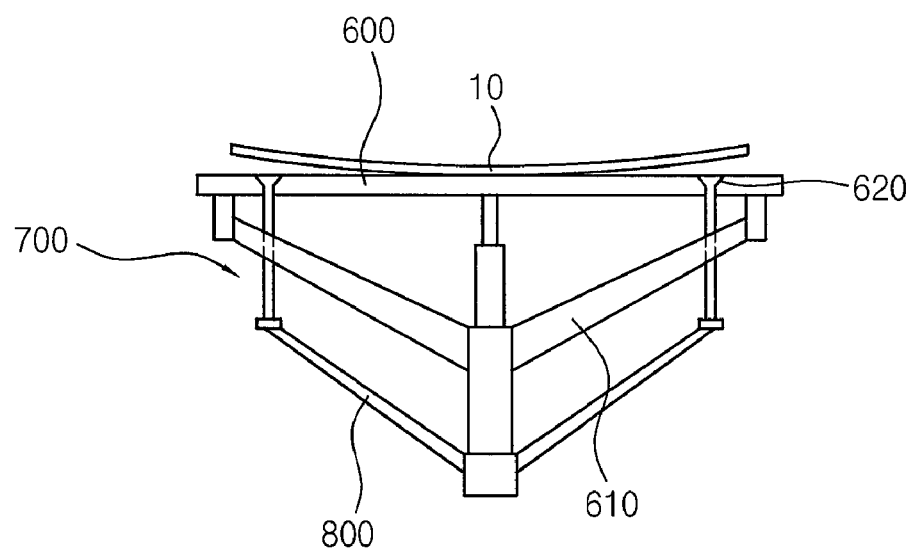
FIG. 7 is a view specifically illustrating a state in which a bending phenomenon occurs in the wafer while performing an epitaxial process in the epitaxial apparatus illustrated in FIG. 1.

FIG. 7 is a view specifically illustrating a state in which a bending phenomenon occurs in the wafer while performing an epitaxial process in the epitaxial apparatus illustrated in FIG. 1. Referring further to FIG. 7, the heat from the heater 300 and the silane gas from the gas supply part 210 are then provided to the wafer 10 placed on the susceptor 600, and the epitaxial process is substantially performed. Here, a bending phenomenon in which the wafer 10 is bent by the heat from the heater 300 naturally occurs.

The glassy carbon constituting the lift pin 700 has a heat conductivity of approximately 3 W/m·K to approximately 6 W/m·K which is relatively lower than those of other ceramic materials. Accordingly, while the epitaxial process is performed, the lift pin 700 transfers only a portion of the heat transferred from the heater 300 to the wafer 10. Thus, a portion of the wafer 10 may be prevented from being deteriorated, the portion contacting the lift pin 700.

Specifically, when the lift pin 700 is formed of a ceramic material having a very high heat conductivity, such as alumina (Al2O3) or silicon carbide (SiC) respectively having heat conductivities of approximately 25 W/m·K to approximately 50 W/m·K or approximately 110 W/m·K to approximately 130 W/m·K, a great heat loss may occur through the lift pin 700. Also, due to the high conductivity of the lift pin 700, the heat directly transferred from the heater 300 is transferred to the wafer 10 as it is through the lift pin 700. Accordingly, since the temperature of the portion contacting the lift pin 700 in the wafer 10 is higher than those of other portions, a deterioration mark may be generated on the portion contacting the lift pin 700 in the wafer 10. However, when the lift pin 700 is formed of glassy carbon as in the present invention, the heat loss through the lift pin 700 is suppressed due to the remarkably low heat conductivity of the glassy carbon. Thus the deterioration mark is prevented from being generated on the wafer 10.

Figure 8:
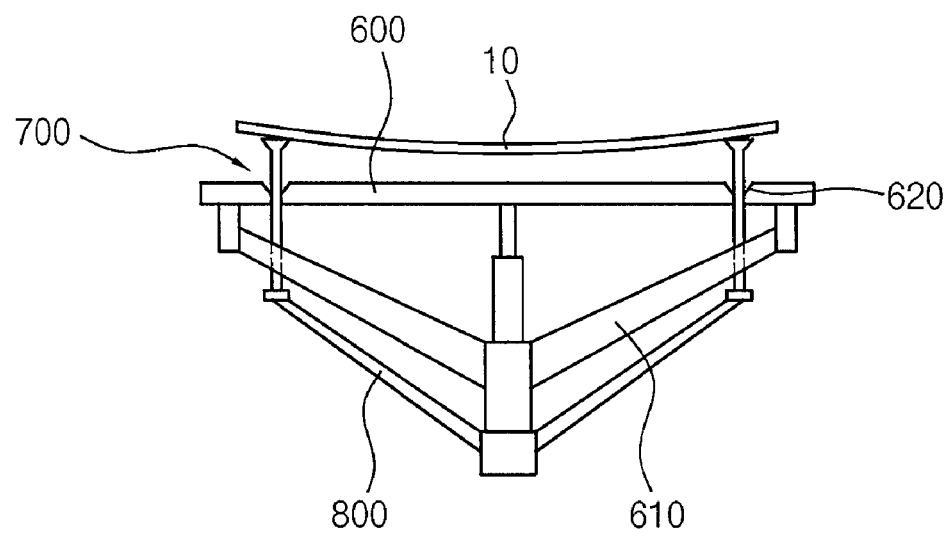
FIG. 8 is a view specifically illustrating a state in which the lift pin supports the wafer in which the bending phenomenon occurs after performing the epitaxial process in the epitaxial apparatus illustrated in FIG. 1.
Figure 9:
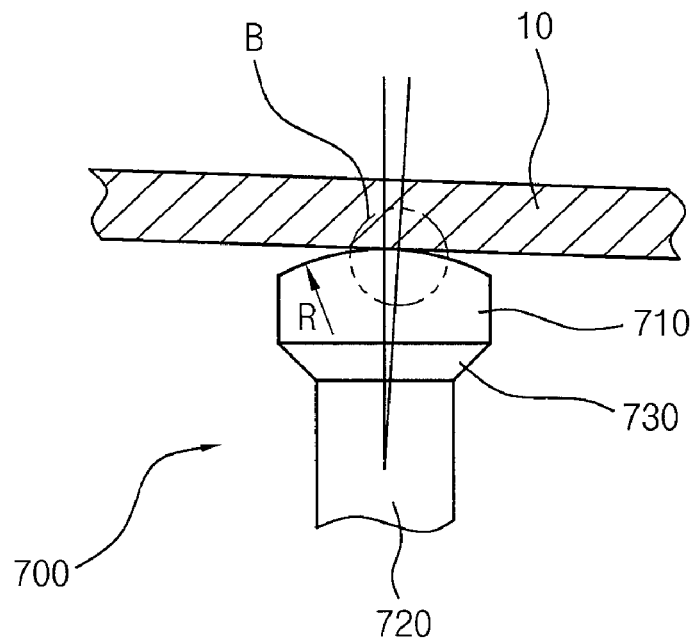
FIG. 9 is a view specifically illustrating a portion on which the lift pin contacts the wafer in FIG. 8.
Figure 10:
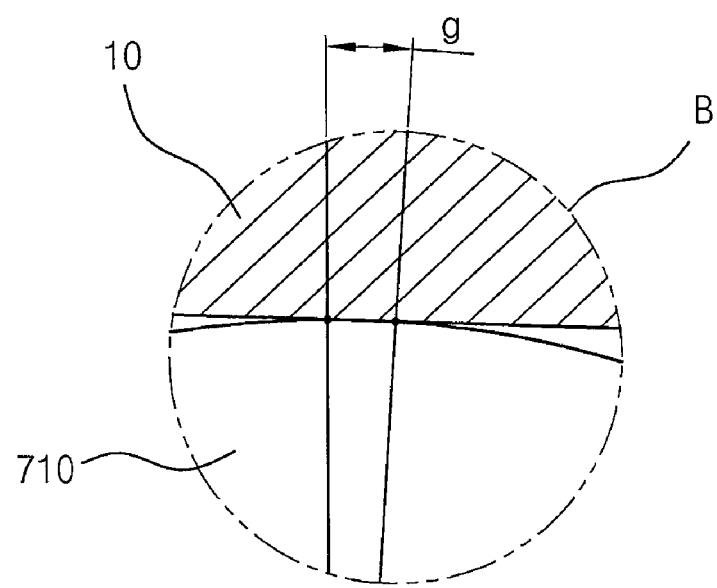
FIG. 10 is an enlarged view illustrating region B of FIG. 9.
Figure 11:
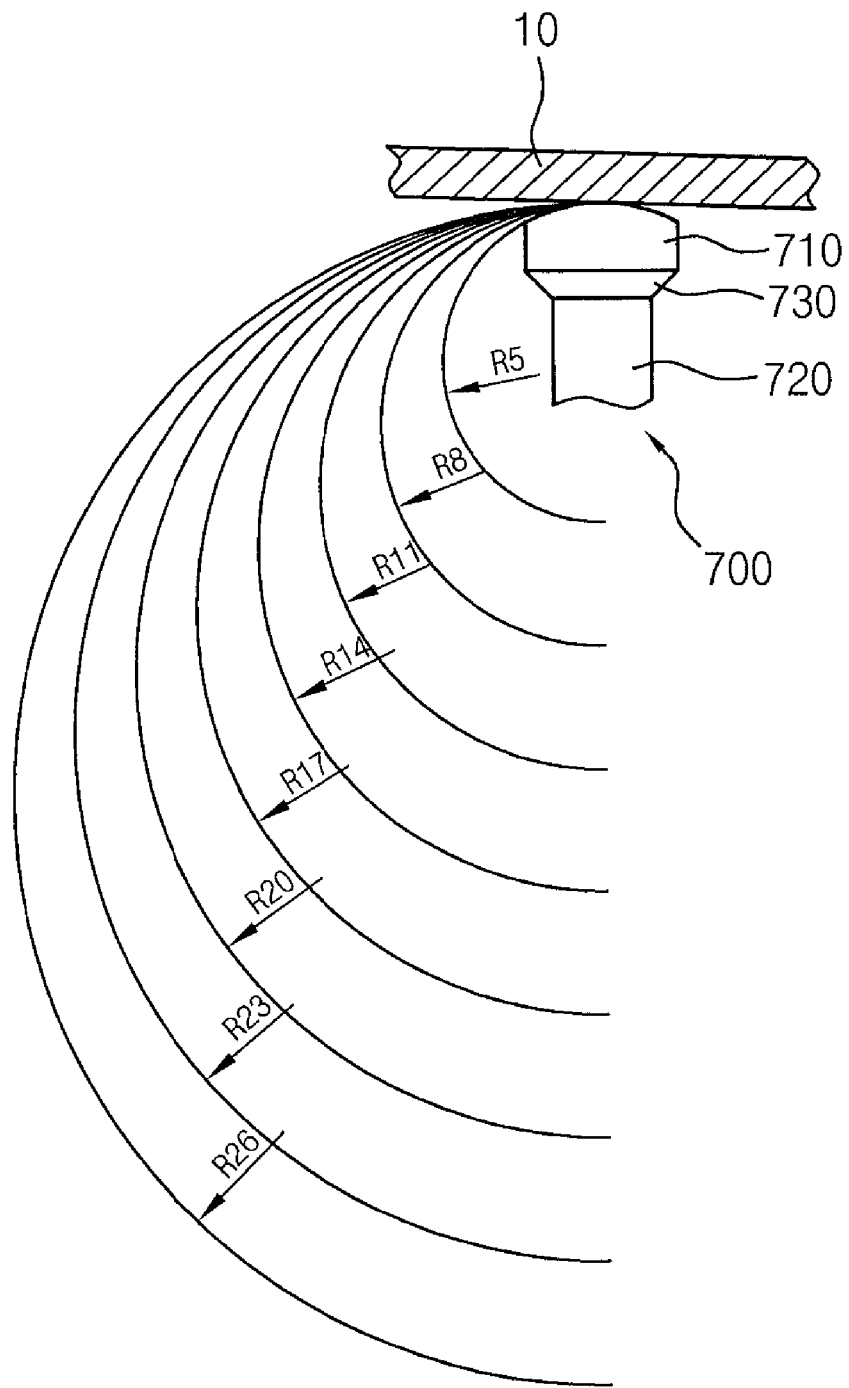
FIG. 11 is a view for describing whether or not scratches and particles are generated in accordance with a curvature of radius of the pin head which contacts the wafer in the lift pin in FIG. 10.

FIG. 8 is a view specifically illustrating a state in which the lift pin supports the wafer in which the bending phenomenon occurs after performing the epitaxial process in the epitaxial apparatus illustrated in FIG. 1, FIG. 9 is a view specifically illustrating a portion on which the lift pin contacts the wafer in FIG. 8, FIG. 10 is an enlarged view illustrating region B of FIG. 9, and FIG. 11 is a view for describing whether or not scratches and particles are generated in accordance with a curvature of radius of the pin head which contacts the wafer in the lift pin in FIG. 10.

Referring further to FIGS. 8 to 11, the lift pin 700 is then moved up by means of the pin drive part 800 such that the wafer 10 on which the bending phenomenon occurs is spaced apart from the susceptor 600.

Through this, the position at which the pin head 710 of the lift pin 700 contacts the wafer 10 on which the bending phenomenon occurs is defined to be spaced a predetermined distance g with respect to the contact point illustrated in FIG. 3 according to the bent degree of the wafer 10. Here, to stably support the wafer 10 on which the bending phenomenon occurs, the pin head 710 is required to have a predetermined range of curvature of radii. Hereinafter, the curvature of radius R of the pin head 710 will be described in more detail.

In the following Table 1, when the epitaxial process is performed with respect to the wafer 10 with a size of 300 mm according to a change of the curvature of radius R of the pin head 710, whether or not scratches are generated on the wafer 10 and particles are generated from the wafer 10 is confirmed and the result thereof is shown. Here, it is shown as "good" when scratches or particles are not generated from the wafer 10, and shown as "bad", otherwise.

TABLE 1

| Curvature of radius (mm) | Scratch | Particle |
| --- | --- | --- |
| R5 | Bad | Bad |
| R8 | Bad | Bad |
| R11 | Good | Good |
| R14 | Good | Good |
| R17 | Good | Good |
| R20 | Bad | Good |
| R23 | Bad | Good |
| R26 | Bad | Bad |

Referring to Table 1, when the curvature of radius R of the pin head 710 is less than 11 mm, it is confirmed that both scratches and particles are generated in all cases, and when the curvature of radius R of the pin head 710 is more than 17 mm, it is confirmed that scratches are generated in all cases. Especially, when the curvature of radius R of the pin head 710 is greater than approximately 23 mm, it is confirmed that even particles are generated together.

Referring to the aforementioned result, when the curvature of radius R of the pin head 710 is less than approximately 11 mm, it seems that in a state in which stresses are concentrated to a contact point at which the pin head 710 contacts the wafer 10, scratches and particles are generated while the contact point is moved by the bending phenomenon of the wafer 10, and thus it is not desirable. Also, when the curvature of radius R of the pin head 710 is more than approximately 17 mm, it seems that scratches and particles are generated because a local contact area in which the pin head 710 contacts the wafer 10 is too large and contact stresses are concentrated to an edge portion of the pin head 710, and thus it is not desirable. Especially, when the curvature of radius R of the pin head 710 is more than approximately 23 mm, it seems that particles are generated because the pin head 710 having a nearly flat shape contacts the wafer 10, and thus it is further not desirable. Accordingly, the portion contacting the wafer 10 in the pin head 710 desirably has a curvature of radius R of approximately 11 mm to approximately 17 mm.

In the current embodiment, it may be understood that although the experiment is performed, to confirm the range of the curvature of radius R of the pin head 710, with respect to wafers 10 having the size of 300 mm, since the difference in the curvature of radius according to the bending phenomenon with respect to other wafers having a size of 200 mm or 400 mm in comparison with the wafer 10 having the size of 300 mm, the range of radii of curvature R of the pin head 710 described above may also be applied, as it is, to the a wafer having the size of 200 mm or 400 mm.

Next, the epitaxial process is performed and the wafer 10 stably supported by the lift pin 700 is carried to the outside, and then a process for manufacturing a highly integrated semiconductor device having a line width of approximately 12 nm to approximately 16 nm is performed.

As such, the lift pin 700 which is driven to move up and down, while passing through the hole 620 of the susceptor 600 on which the wafer 10 is placed inside the process chamber 200 in which the epitaxial process is performed, to substantially support the wafer 10 is manufactured of a glassy carbon material which has a superior hardness such that a portion contacting the wafer 10 in the lift pin 700 may be machined to be rounded, so that the wafer 10 on which a bending phenomenon occurs during the epitaxial process may be stably supported without generating scratches and particles.

Accordingly, when the epitaxial process is performed by using the lift pin 700, a thin film for decreasing the surface roughness of the surface of the wafer 10 may be stably formed. Therefore, the quality of highly integrated semiconductor devices manufactured from the wafer 10 may be improved and a high yield of semiconductor devices may also be simultaneously expected.

While exemplary embodiments are described above, a person skilled in the art may understand that many modifications and variations may be made without departing from the spirit and scope of the present invention defined in the following claims.

INDUSTRIAL APPLICABILITY

As described above, the present invention prevents scratches and particles from being generated by a lift pin by manufacturing the lift pin used for an epitaxial process by using a glassy carbon material such that a portion of the lift pin contacting the wafer is roundly machined. Thus, scratches and particles are prevented from being generated by the lift pin while performing the epitaxial process, and may thereby be used to improve the quality of the wafer.

The invention claimed is:

1. A lift pin passing through a hole of a susceptor on which a wafer is placed inside a process chamber in which an epitaxial process for the wafer is performed, to support the wafer, and having a surface formed of a glassy carbon material, the lift pin comprising:
   a pin head formed at an upper part of the lift pin, the upper part contacting the wafer;
   a shaft passing through the hole of the susceptor; and
   a pin neck comprising, between the pin head and the shaft, an outer circumferential surface inclinedly formed to be gradually narrower from the pin head to the shaft,
   wherein the lift pin includes a base member formed of ceramic material, and the glassy carbon material coated on the base member,
   wherein a mirror surface treatment is performed on the glassy carbon material of the lift pin to reduce a friction among the lift pin, the wafer, and the susceptor to stably prevent a generation of particles caused by the friction,
   wherein a heat conductivity of the glassy carbon is relatively lower than a heat conductivity of the base member made of the ceramic material in order to prevent the portion of the wafer contacting the lift pin from deteriorating.

2. The lift pin of claim 1, wherein the pin head comprises a portion which contacts the wafer and has a rounded shape.

3. The lift pin of claim 2, wherein the contact portion of the pin head which contacts the wafer has a curvature of radius (R) of approximately 11 mm to approximately 17 mm.

4. The lift pin of claim 1, wherein the pin neck has an inclined angle within ±5° with respect to an inclination angle formed on an upper end portion of the hole.

5. The lift pin of claim 1, wherein the shaft has an outer diameter smaller by approximately 2% to approximately 10% than the diameter of the hole.

6. The lift pin of claim 1, wherein the pin head, the shaft, and the pin neck comprise surfaces having a roughness of approximately 0.1 μm to approximately 0.5 μm.

7. A method of manufacturing a lift pin, which passes through a hole of a susceptor on which a wafer is placed to support the wafer inside a process chamber in which an epitaxial process for the wafer is performed, the method comprising:
   preparing a base having a surface formed of a glassy carbon material including: a pin head contacting the wafer to support the wafer; a shaft passing through the hole of the susceptor; and a pin neck formed between the pin head and the shaft; and
   performing a mirror surface treatment on the glassy carbon material of the base to reduce a friction among the lift pin, the wafer, and the susceptor to stably prevent a generation of particles caused by the friction,
   wherein the base is prepared by coating a base member formed of ceramic material with the glassy carbon material,
   wherein a heat conductivity of the glassy carbon is relatively lower than a heat conductivity of the base member made of the ceramic material in order to prevent the portion of the wafer contacting the lift pin from deteriorating.

8. The method of claim 7, wherein in the performing of a mirror surface treatment, the surface of the base is polished to have a roughness of approximately 0.1 μm to approximately 0.5 μm.

* * * * *